US007586793B2

(12) United States Patent
Cernea (10) Patent No.: US 7,586,793 B2
(45) Date of Patent: *Sep. 8, 2009

(54) DYNAMIC COLUMN BLOCK SELECTION

(75) Inventor: Raul-Adrian Cernea, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/241,000

(22) Filed: Sep. 29, 2005

(65) Prior Publication Data

US 2006/0028874 A1 Feb. 9, 2006

Related U.S. Application Data

(63) Continuation of application No. 10/818,887, filed on Apr. 5, 2004, now Pat. No. 6,985,388, which is a continuation-in-part of application No. 10/414,372, filed on Apr. 14, 2003, now Pat. No. 6,822,911, which is a continuation of application No. 09/956,416, filed on Sep. 17, 2001, now Pat. No. 6,560,146, application No. 11/241,000, which is a continuation-in-part of application No. 10/751,097, filed on Dec. 31, 2003, now Pat. No. 7,170,802.

(51) Int. Cl.
*G11C 7/00* (2006.01)
(52) U.S. Cl. ................ 365/189.05; 365/233.5
(58) Field of Classification Search ............ 365/189.05, 365/233, 233.5
See application file for complete search history.

(56) References Cited

U.S. PATENT DOCUMENTS

| 3,710,348 | A | | 1/1973 | Craft |
| 3,895,360 | A | | 7/1975 | Cricchi et al. |
| 4,034,356 | A | * | 7/1977 | Howley et al. ................ 326/39 |

(Continued)

FOREIGN PATENT DOCUMENTS

CN          1568522 A       1/2005

(Continued)

OTHER PUBLICATIONS

European Patent Office, International Searching Authority, "Notification of Transmittal of the International Search Report or Declaration", PCT Application No. PCT/US/02/29527, Feb. 10, 2003, 6 pages.

(Continued)

*Primary Examiner*—Michael T Tran
(74) *Attorney, Agent, or Firm*—Davis Wright Tremaine LLP (57) ABSTRACT

Selecting circuits for columns of an array of memory cells are used to hold read data or write data of the memory cells. The memory cells may be multistate memory cells. There is a shift register chain, having a stage for columns of the array. A strobe pulse is shifted through this shift register. The strobe points, with each clock, at and enables a different selecting circuit in sequence. That particular selecting circuit that has been enabled by the strobe will then perform a certain function. In a read mode, the selected selecting circuit will send the stored information through to the output buffer for output from the integrated circuit. And while in a programming mode, the selected selecting circuit will receive data from an input buffer. This data will be written into a memory cell.

12 Claims, 8 Drawing Sheets

U.S. PATENT DOCUMENTS

| | | | |
|---|---|---|---|
| 4,266,271 A | | 5/1981 | Chamoff et al. |
| 4,314,334 A | | 2/1982 | Daughton et al. |
| 4,402,067 A | | 8/1983 | Moss et al. |
| 4,720,815 A | | 1/1988 | Ogawa |
| 4,757,477 A | | 7/1988 | Nagayama et al. |
| 4,800,530 A | * | 1/1989 | Itoh et al. ............... 365/189.12 |
| 4,835,549 A | * | 5/1989 | Samejima et al. ........... 347/237 |
| 5,095,344 A | | 3/1992 | Harari |
| 5,168,463 A | * | 12/1992 | Ikeda et al. ................... 365/78 |
| 5,172,338 A | | 12/1992 | Mehrotra et al. |
| 5,200,959 A | | 4/1993 | Gross et al. |
| 5,270,979 A | | 12/1993 | Harari et al. |
| 5,297,029 A | * | 3/1994 | Nakai et al. ............. 365/238.5 |
| 5,315,541 A | | 5/1994 | Harari et al. |
| 5,369,618 A | | 11/1994 | Takasugi |
| 5,380,672 A | | 1/1995 | Yuan et al. |
| 5,386,390 A | | 1/1995 | Okitaka |
| 5,422,842 A | * | 6/1995 | Cernea et al. .......... 365/185.22 |
| 5,428,621 A | | 6/1995 | Mehrotra et al. |
| 5,430,679 A | | 7/1995 | Hiltebeitel et al. |
| 5,430,859 A | | 7/1995 | Norman et al. |
| 5,432,741 A | * | 7/1995 | Devore et al. .......... 365/185.14 |
| 5,442,748 A | | 8/1995 | Chang et al. |
| 5,479,370 A | | 12/1995 | Furuyama et al. |
| 5,485,425 A | | 1/1996 | Iwai et al. |
| 5,602,987 A | | 2/1997 | Harari et al. |
| 5,606,584 A | * | 2/1997 | Beat ............................ 377/26 |
| 5,642,312 A | | 6/1997 | Harari |
| 5,657,332 A | | 8/1997 | Auclair et al. |
| 5,663,901 A | | 9/1997 | Wallace et al. |
| 5,712,180 A | | 1/1998 | Guterman et al. |
| 5,726,947 A | * | 3/1998 | Yamazaki et al. ...... 365/230.03 |
| 5,783,958 A | | 7/1998 | Lysinger |
| 5,848,009 A | | 12/1998 | Lee et al. |
| 5,862,080 A | | 1/1999 | Harari et al. |
| 5,890,192 A | | 3/1999 | Lee et al. |
| 6,028,472 A | * | 2/2000 | Nagumo ..................... 327/512 |
| 6,038,184 A | | 3/2000 | Naritake |
| 6,091,666 A | | 7/2000 | Arase et al. |
| 6,151,248 A | | 11/2000 | Harari et al. |
| 6,172,917 B1 | * | 1/2001 | Kataoka et al. ......... 365/189.05 |
| 6,222,757 B1 | * | 4/2001 | Rau et al. ................... 365/154 |
| 6,222,762 B1 | | 4/2001 | Guterman et al. |
| 6,230,233 B1 | | 5/2001 | Lofgren et al. |
| 6,252,800 B1 | | 6/2001 | Chida |
| 6,256,230 B1 | * | 7/2001 | Miwa et al. ............ 365/185.24 |
| 6,426,893 B1 | | 7/2002 | Conley et al. |
| 6,480,423 B2 | | 11/2002 | Toda et al. |
| 6,496,431 B1 | | 12/2002 | Nakahara et al. |
| 6,512,263 B1 | | 1/2003 | Yuan et al. |
| 6,522,580 B2 | | 2/2003 | Chen et al. |
| 6,560,146 B2 | * | 5/2003 | Cernea .................. 365/189.05 |
| 6,594,177 B2 | | 7/2003 | Matarrese et al. |
| 6,609,209 B1 | * | 8/2003 | Tiwari et al. ................ 713/322 |
| 6,771,536 B2 | | 8/2004 | Li et al. |
| 6,795,837 B1 | * | 9/2004 | Wells ............................ 708/3 |
| 6,813,184 B2 | | 11/2004 | Lee |
| 6,822,911 B2 | | 11/2004 | Cernea |
| 6,842,160 B2 | * | 1/2005 | Yamazaki et al. ............. 345/76 |
| 6,853,596 B2 | | 2/2005 | Cheung |
| 6,862,217 B2 | | 3/2005 | Kawabata |
| 6,891,753 B2 | | 5/2005 | Cernea |
| 6,983,428 B2 | | 1/2006 | Cernea |
| 6,985,388 B2 | | 1/2006 | Cernea |
| 6,990,018 B2 | | 1/2006 | Tanaka et al. |
| 7,023,736 B2 | | 4/2006 | Cernea et al. |
| 7,027,330 B2 | | 4/2006 | Park |
| 7,057,339 B2 | | 6/2006 | Boroson et al. |
| 7,110,294 B2 | | 9/2006 | Kawai |
| 7,170,802 B2 | | 1/2007 | Cernea et al. |
| 7,405,985 B2 | | 7/2008 | Cernea et al. |
| 2003/0016182 A1 | | 1/2003 | Lohr |
| 2003/0161182 A1 | | 8/2003 | Li et al. |
| 2003/0223274 A1 | | 12/2003 | Cernea |
| 2004/0057283 A1 | | 3/2004 | Cernea |
| 2004/0057287 A1 | | 3/2004 | Cernea |
| 2004/0060031 A1 | | 3/2004 | Cernea |
| 2004/0109357 A1 | | 6/2004 | Cernea et al. |

FOREIGN PATENT DOCUMENTS

| | | |
|---|---|---|
| EP | 1 681 680 A2 | 7/2006 |
| JP | 61-292747 | 12/1986 |
| JP | S62-287497 A | 12/1987 |
| JP | 01128297 | 5/1989 |
| JP | 06-150666 | 5/1994 |
| JP | H11-162183 | 6/1999 |
| WO | WO 92/22068 A1 | 12/1992 |
| WO | WO 03/025939 A2 | 3/2003 |

OTHER PUBLICATIONS

EPO/ISA, "Notification of Transmittal of the International Search Report and the Written Opinion of the International Searching Authority, or the Declaration," mailed in PCT/US2004/042990 on May 3, 2005, 11 pages.

EPO, "Examiner's First Full Report", mailed in related EP Application 02 773 439.1, Oct. 21, 2004, 3 pages.

The Patent Office of the People's Republic of China, "Office Action," mailed in related Chinese Patent Application No. 02818167.0 on Jul. 13, 2007, 15 pages (including translation).

EPO, "Office Action," mailed in related European Patent Application No. 05 077 828.1 on Aug. 29, 2007, 3 pages.

The Patent Office of the People's Republic of China, "Office Action," mailed in related Chinese Patent Application No. 02818167.0 on Mar. 21, 2008, 7 pages (including translation).

Japanese Patent Office, "Notification of Reasons for Refusal," mailed in related Japanese Patent Application No. 2003-529471 on May 13, 2008, 6 pages (including translation.).

European Patent Office, "European Search Report," mailed in related European Patent Application No. 05 07 7828 on Jun. 6, 2006, 5 pages.

KRO, "Notice of Preliminary Rejection," corresponding Korean Patent Application No. 2004-7003926, mailed on Sep. 30, 2008, 5 pages (including translation.).

JPO, "Decision of Refusal," corresponding Japanese Patent Application No. 2003-529471, mailed on Dec. 16, 2008, 4 pages (including translation.).

* cited by examiner

DYNAMIC COLUMN BLOCK SELECTION

CROSS REFERENCE TO RELATED APPLICATIONS

This application is a continuation of U.S. application Ser. No. 10/818,887, filed Apr. 5, 2004, now U.S. Pat. No. 6,985,388, which in turn is a continuation-in-part of U.S. application Ser. No. 10/414,372, filed Apr. 14, 2003, now U.S. Pat. No. 6,822,911, which in turn is a continuation of U.S. application Ser. No. 09/956,416, filed Sep. 17, 2001, now U.S. Pat. No. 6,560,146. This application is also a continuation-in-part of U.S. Ser. No. 10/751,097, filed Dec. 31, 2003, now U.S. Pat. No. 7,170,802. These applications are incorporated herein in their entirety for all purposes by this reference.

BACKGROUND OF THE INVENTION

The present invention relates to nonvolatile erasable programmable memories and more specifically, techniques for reading and writing data for these types of memories.

Memory and storage is one of the key technology areas that is enabling the growth in the information age. With the rapid growth in the Internet, World Wide Web (WWW), wireless phones, personal digital assistant, digital cameras, digital camcorders, digital music players, computers, networks, and more, there is continually a need for better memory and storage technology. A particular type of memory is nonvolatile memory. A nonvolatile memory retains its memory or stored state even when power is removed. Some types of nonvolatile erasable programmable memories include Flash, EEPROM, EPROM, MRAM, FRAM, ferroelectric, and magnetic memories. Some nonvolatile storage products include CompactFlash (CF) cards, MultiMedia cards (MMC), Flash PC cards (e.g., ATA Flash cards), SmartMedia cards, and memory sticks.

A widely used type of semiconductor memory storage cell is the floating gate memory cell. Some types of floating gate memory cells include Flash, EEPROM, and EPROM. The memory cells are configured or programmed to a desired configured state. In particular, electric charge is placed on or removed from the floating gate of a Flash memory cell to put the memory into two or more stored states. One state is an erased state and there may be one or more programmed states. Alternatively, depending on the technology and terminology, there may be a programmed state and one or more erased states. A Flash memory cell can be used to represent at least two binary states, a 0 or a 1. A Flash memory cell can store more than two binary states, such as a 00, 01, 10, or 11; this cell can store multiple states and may be referred to as a multistate memory cell. The cell may have more than one programmed states. If one state is the erased state (00), the programmed states will be 01, 10, and 11, although the actual encoding of the states may vary.

A number of architectures are used for non-volatile memories. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, 6,151,248, 6,426,893, and 6,512,263.

A NAND array of one design has a number of memory cells, such as 8, 16 or even 32, connected in series string between a bit line and a reference potential through select transistors at either end. Word lines are connected with control gates of cells in different series strings. Relevant examples of such arrays and their operation are given in U.S. Pat. No. 6,522,580, that is also hereby incorporated by reference.

Despite the success of nonvolatile memories, there also continues to be a need to improve the technology. It is desirable to improve the density, speed, durability, and reliability of these memories. It is also desirable to reduce power consumption.

As can be seen, there is a need for improving the operation of nonvolatile memories. Specifically, by using a technique of dynamic column block selection of the memory cells, this will reduce noise in the operation of the integrated circuit, which will permit the integrated circuit to operate more reliably. Further, the technique will also reduce the area required by the block selection circuitry, which will reduce the cost of manufacture.

SUMMARY OF THE INVENTION

The invention provides a technique of accessing selecting circuits assigned to columns of an array of memory cells to hold data read or to be written into the memory cells. The selecting circuits may be latches. In a specific embodiment, the memory cells are multistate memory cells. There is a shift register, acting as a pointer, having a stage for each column block of the array. A strobe pulse is shifted through this shift register. The strobe points, with each clock, at and enables a different circuit in sequence. That particular selecting circuit that has been enabled by the strobe will then perform a certain operation. In a read mode, the selected selecting circuit will transfer the stored information through an output line to the output buffer for output from the integrated circuit. And while in a programming mode, the selected selecting circuit will receive data from an input buffer. This data will be written into a memory cell.

In one specific embodiment, the invention is an integrated circuit including a number of nonvolatile memory cells arranged in rows and columns. A number of read/write circuits are connected to a number of array columns of memory cells. In an embodiment, a read/write circuit includes a sense amplifier circuit. A number of first latch circuits are connected to the same set of read/write circuits and a first I/O line. A number of second latch circuits are connected to one or more sense amplifiers and a second I/O line. There is a shift register chain including a number of shift register stages, acting as pointers. Each stage has a data input and a data output. Each stage has a clock input. Each shift register has its input connected to the previous shift register output and the output connected to the next shift register input.

Accordingly, those cells are floating gate devices. Flash, EEPROM, or EPROM memory cells are some examples of floating gate devices. The first latches may be implemented using a pair of cross-coupled inverters. The second latches may be implemented using a pair of cross-coupled inverters. Other techniques for implementing a latch may be used such as using other logic gates including NAND and NOR. Each stage of the shift register may be a master-slave-type register. Each memory cell may store a plurality of bits of data. The memory cells may be multistate memory cells. One of the first latch circuits and one of the second latch circuits may hold data to be written into or read from a single memory cell for a column of the memory cells. The first latches are connected between the first I/O line and a different one of the read/write circuits. Furthermore, the second latches are connected between the second I/O line and the same read/write circuit as the first latch one of the sense amplifiers.

The first and second latches are not part of a shift register. The first latch circuits do not form a shift register. The second latch circuits do not form a shift register. Therefore, data is not serially passed from one of the first latch circuits to a next one of the first latch circuits. Data is not serially passed from one of the second latch circuits to a next one of the second latch circuits.

In another embodiment, the invention is a method of operating an integrated circuit. A first latch is provided to hold data associated with a first column of memory cells. A second latch is provided to hold data associated with a second column of memory cells. A shift register is provided having a first stage with an output connected to an enable input of the first latch, and a second stage with an output connected to an enable input of the second latch. A strobe bit is loaded into the first stage of the shift register to enable connecting of the first latch to an I/O line. The shift register is clocked to advance the strobe bit from the first stage of the shift register to the second stage to enable connecting of the second latch to the I/O line. Connecting of the first latch to the I/O line is disabled upon clocking the shift register.

Other objects, features, and advantages of the present invention will become apparent upon consideration of the following detailed description and the accompanying drawings, in which like reference designations represent like features throughout the figures.

DETAILED DESCRIPTION

Integrated circuits providing nonvolatile storage include nonvolatile erasable-programmable memory cells. Many types of integrated circuits having nonvolatile memory cells include memories, microcontrollers, microprocessors, and programmable logic. Nonvolatile memory integrated circuits may be combined with other nonvolatile memory integrated circuits to form larger memories. The nonvolatile memory integrated circuits may also be combined with other integrated circuits or components such as controllers, microprocessors, random access memories (RAM), or I/O devices, to form a nonvolatile memory system. An example of a Flash EEPROM system is discussed in U.S. Pat. No. 5,602,987, which is incorporated by reference along with all references cited in this application.

Further discussion of nonvolatile cells and storage is in U.S. Pat. Nos. 5,095,344, 5,270,979, 5,380,672, 5,712,180, 6,222,762, and 6,230,233, which are incorporated by reference.

Some types of nonvolatile storage or memory cells include Flash, EEPROM, and EPROM. There are many other types of nonvolatile memory technologies and the present invention may be applied to these technologies as well as other technologies. Some examples of other nonvolatile technologies include MRAM and FRAM cells. This patent application discusses some specific embodiments of the invention as applied to Flash or EEPROM technology. However, this discussion is to provide merely an specific example of an application of the invention and is not intended to limit the invention to Flash or EEPROM technology.

Figure 1:
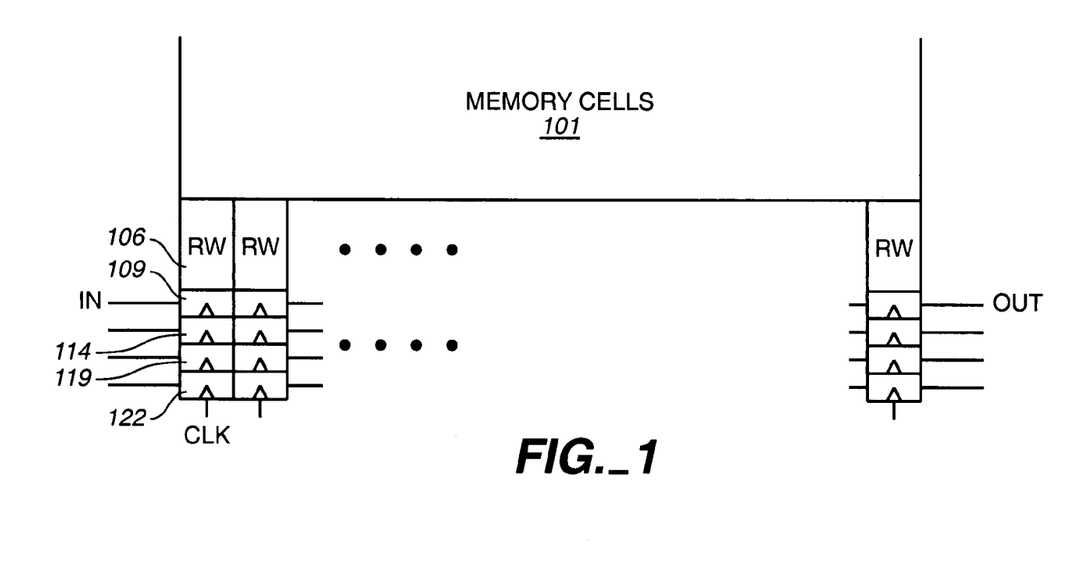
FIG. 1 shows an integrated circuit with shift registers for holding data to be read and written into the memory.

FIG. 1 shows a memory integrated circuit with memory cells 101. The integrated circuit may be a memory such as a Flash chip or may be an integrated circuit with a embedded memory portion, such as an ASIC or microprocessor with memory. The memory cells store binary information. In a specific embodiment, the memory cells are nonvolatile memory cells. Examples of some nonvolatile memory cells are floating gate cells, which include Flash, EEPROM, or EPROM cells. The memory cells are arranged in an array of rows and columns. There may be any number of rows and columns read/write circuit 106 are coupled to columns of the memory cells. In an embodiment, there is one read/write circuit for each column of memory cells. In other embodiments, one read/write circuit may be shared among two or more columns of memory cells. Sense amplifiers are used to read the states of the memory cells. The sense amplifies may also be combined with other circuits in order to write or store data into the memory cells. The combination is referred to as a read/write circuit.

In a specific embodiment, the memory cells are multistate cells, capable of storing multiple bits of data per cell. In FIG. 1, the memory cells store two bits of data. This dual-bit memory cell was selected in order to illustrate the principles of the invention. Multistate memory cells may store more than two bits of data, such as three, four, and more.

FIG. 1 shows four shift registers 109, 114, 119, and 122. Each shift register stage has an input of IN and an output or OUT. Data is clocked in and out of the registers using a clock input at a CLK input. The clock input is connected to all the registers.

Figure 2:
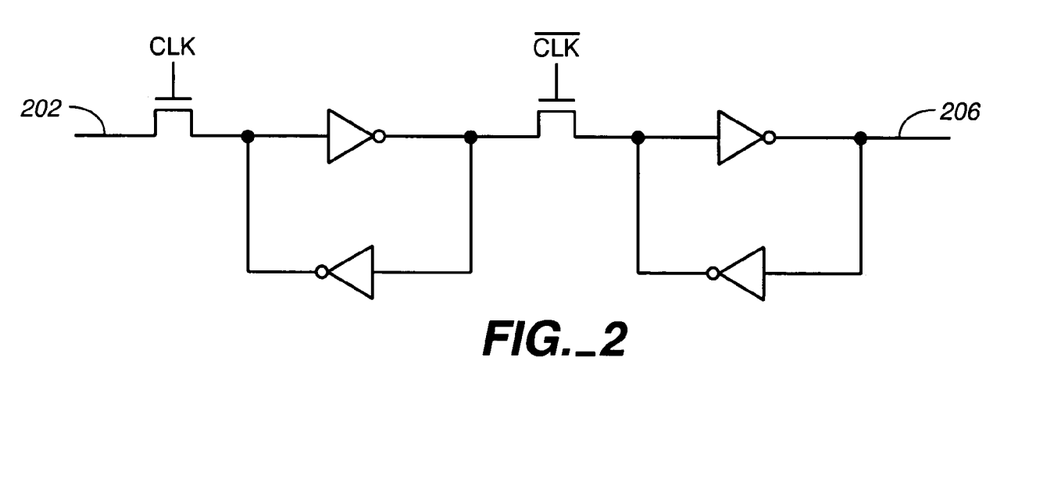
FIG. 2 shows an implementation of a master-slave register.

An example of a specific circuit implementation of a register of the shift register is shown in FIG. 2. This is known as a master-slave register. There are other circuit implementations for a register that may be used. An input 202 is the input to the shift register or is connected to a previous stage of the shift register. An output 206 is the output to the shift register or is connected to a next stage of the shift register.

Each of the four shift registers has one register which is associated with and connected to a particular read-write (RW) circuit. Each read-write circuit includes circuitry to read a state of memory cell and circuitry to write data into a memory cell. The circuitry was shown as a single block, but could also be drawn as two blocks, one for the write circuitry and one for the read circuitry. An example of read circuitry is a sense amplifier (SA) circuit. In other words, each read-write circuit has four registers associated with it. Two of these registers are used to hold the data to be written into the memory cell. Two registers are used to load the new data to be written while programming is proceeding, for improved performance. For example, registers 109 and 114 may be used to hold write data, and registers 117 and 122 may be used to load write data. The write data is serially streamed into the shift registers using IN and then written using read-write circuitry (i.e., write circuit) into the memory cells. Data from the memory cells is read out using the read-write circuit (i.e., read circuit or sense amplifier) and stored into the registers. The sense amplifiers can sense in parallel and dump data in parallel, in the shift registers.

For memory cells that hold more than two bits per cell, there would be an additional register for each additional bit. For example, for three bits per cell, there would be an additional two shift registers. Three registers for read data, and three registers for write data.

The embodiment of FIG. 1 shows a separate set of registers for loading/unloading and actual read and write data. In other embodiments, one set of registers may be shared to handle both load and write or read and unload; this will save integrated circuit area. However, by having individual sets of registers for load and write or read and unload, this improves performance because both types of operation can occur at the same time. Furthermore, in an alternative embodiment, there may be separate clocks, such as a read clock and a write clock, for the read and write registers. This will allow independent inputting of data into the respective read or write data shift register.

As bits are clocked into and out of the shift registers, depending on the particular pattern of the data, there may be a significant amount of switching noise. For example, if the pattern were a string of alternating 0s and 1s (i.e., 01010101 . . . 0101), this would generate a lot of switching noise because there will be full rail transitions occurring at each clock. And the noise if further dependent on the number of shift registers switching at the same time.

In summary for the approach in FIG. 1, the circuits store and transfer data by means of shift registers: In read mode, read circuitry or sense amplifiers dump data into shift registers, then data are streamed out. During programming, data are shifted in and stored into these shift registers. Shift registers are made of two latches, a "master" and a "slave." Shifting in or out data through the masters and the slaves creates a lot of noise, depending upon data pattern. For example, if data is mostly alternating 0s and 1s, then thousand of masters and slaves will toggle their outputs accordingly.

Figure 3:
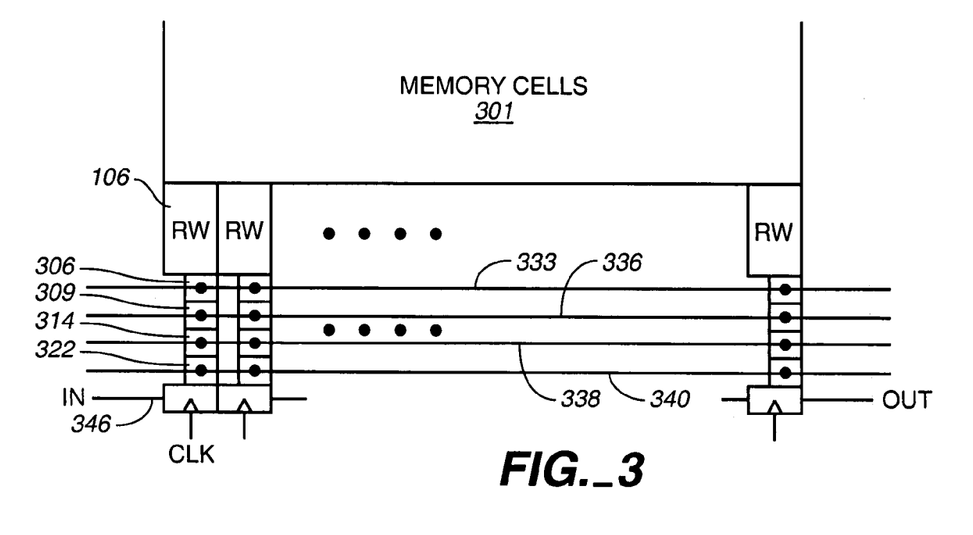
FIG. 3 shows an integrated circuit with latches for holding data to be read and written into the memory.

FIG. 3 shows another circuit architecture for reading and writing data to memory cells 301 of an integrated circuit. This architecture requires less integrated circuit area and generates less noise than that in FIG. 1, especially for high density, multistate memory cells. The integrated circuit may be a memory such as a Flash chip or may be an integrated circuit with a embedded memory portion, such as an ASIC or microprocessor with memory. The memory cells store binary information. In a specific embodiment, the memory cells are nonvolatile memory cells. Examples of some nonvolatile memory cells are floating gate, Flash, or EEPROM cells. The memory cells are arranged in an array of rows and columns. The may be any number of rows and columns.

Read-write (RW) circuits 106 are coupled to columns of the memory cells. In an embodiment, there is one read-write circuit for each column of memory cells. In other embodiments, one read-write circuit may be shared among two or more columns of memory cells. The read-write circuits are used to read the states of the memory cells. The read-write circuits may be also used to write or store data into the memory cells. The read-write circuitry may include sense amplifier circuits, as discussed above.

In a specific embodiment, the memory cells are multistate cells, capable of storing multiple bits of data per cell. As with the embodiment of FIG. 1, for the purpose of serving as an exemplary embodiment, memory cells 301 of FIG. 3 are dual-bit multibit memory cells. This dual-bit memory cell was selected in order to illustrate the principles of the invention. Multistate memory cells may store more than two bits of data, such as three, four, and more. And, the principles of the invention would also apply. As the number of bits that can be stored in a single multistate cell increases, the advantages of the architecture in FIG. 3 over that in FIG. 1 also increase.

There are temporary storage circuits or four data latches 306, 309, 314, and 322 associated with and connected to each read-write circuit. The temporary storage circuits may be any circuitry used to hold data for the memory cells. In a specific implementation, the temporary storage circuits are latches. However, other types of logic may also be used. The connection is not shown. Each latch is connected to one of four input lines, 333, 336, 338, and 340. These input lines are lines used to input data into the latches. Data is loaded into a particular latch based on an ENABLE signal input of each latch (not shown). When the LOAD signal is asserted (active low or active high signal) for a particular latch, then that latch is loaded.

In the figure, the input lines are shown running on top of the latches. They may also run beside the latches. Also, in other embodiments of the invention, there may be a single input line and data from the input line is shifted into the latches serially.

Figure 4:
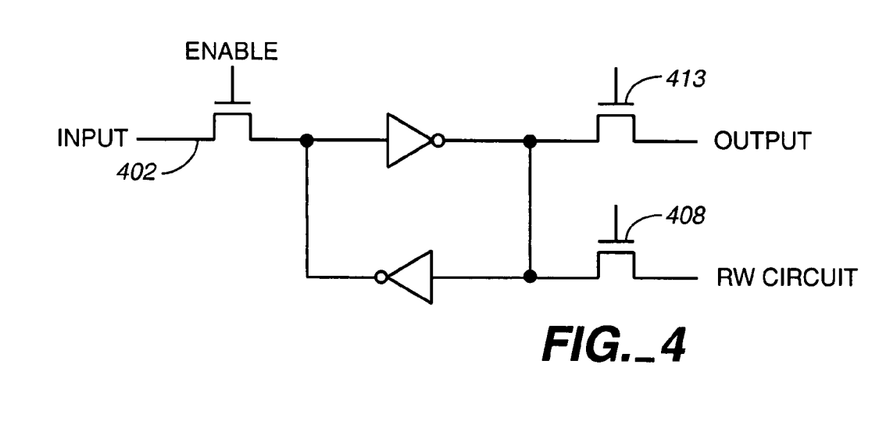
FIG. 4 shows an implementation of a latch.

An example of a specific circuit implementation of a latch is shown in FIG. 4. Other circuit implementation for a latch that may also be used. An input 402 is the input of the latch and will be connected to an input line. The ENABLE signal is connected to a pass transistor or pass gate that allows data to be connected to or disconnected from input 402. This latch circuit includes cross-coupled inverters to hold data. The latch also connects to the read-write circuit so that data may be passed between the circuits (such as by using pass transistor 408). The latch also connects to the output through a pass transistor 413. There are other possible implementations. For example, an input/output (I/O) line may be used, so only one of the pass transistors 402 or 413 is needed. The single pass transistor would connect the latch to the I/O line. Further, instead of inverters, other logic gates may be used, such as NAND, NOR, XOR, AND, and OR gates, and combinations of these.

Note that this circuitry contains half the circuitry of a master-slave register as shown in FIG. 2. The master portion of a master-slayer register is one latch, and the slave portion is another latch.

Also, the implementation shows an NMOS or n-channel pass transistor. There are many ways to form a pass gate, and any of these techniques may be used. For example, a CMOS pass gate may be used. A CMOS pass gate includes NMOS and PMOS transistors connected in parallel. Also, a high voltage pass gate may be used. For example, a high-voltage NMOS pass gate is enabled or turned on (or placed in an on state) by placing a high voltage, above VCC, at its gate or control electrode. An NMOS pass gate are turned off or put in an off state by placing its control electrode at VSS or ground.

The circuitry in FIG. 3 further includes a shift register 346, one stage for each read-write circuit. This shift register is similar to one shift register of FIG. 1. The output of each shift register stage is connected to the ENABLE signal input of the particular latches that stage is associated with.

In this particular embodiment, each read-write circuit is connected to and has four latches associated with it. Two of these latches are used to hold the data to be written into the memory cell. Two latches are used to load the data to be written into the memory cell during the next write cycle. For example, latches 306 and 309 may be used to hold write data, and latches 314 and 322 may be used to hold load new data. Accordingly, during the read mode, two latches are used to hold and unload current data, while new data is prepared in the other two latches.

The write data is input into the latches via the appropriate input lines and then written using the appropriate read-write circuit into the memory cells. Data from the memory cells is read out using the sense amplifier and stored into the latches. The read data is output from the latches using the appropriate output lines. The communication line between the latch and the read-write circuit as well as the output line is not shown.

Data is input from the latches one at a time using the input lines. This is done by using an ENABLE signal, so that the latches associated with a read-write circuit or column in the array are connected to the input lines one at a time. The ENABLE signal for the latches comes from the shift registers. The shift registers are loaded with a pattern (for active high logic) which is all 0s, except for one 1 (e.g., 0001000000). This bit may be referred to as a strobe bit. For example, shift register associated with the first column has a 1, and the rest of the shift register contain 0. This 1 is connected to the ENABLE input of the latches for the first column, which connects one or more of these latches to the I/O lines 333, 336, 338, and 340. Data can be read or written to this column. The input to the shift register is connected to 0 and the shift register is clocked. The 1 propagates to the next shift register stage. This 1 is connected to the ENABLE input of the latches for the second column, which connects these latches to the I/O lines. This operation continues until the desired data is read or written from the latches.

Figure 5:
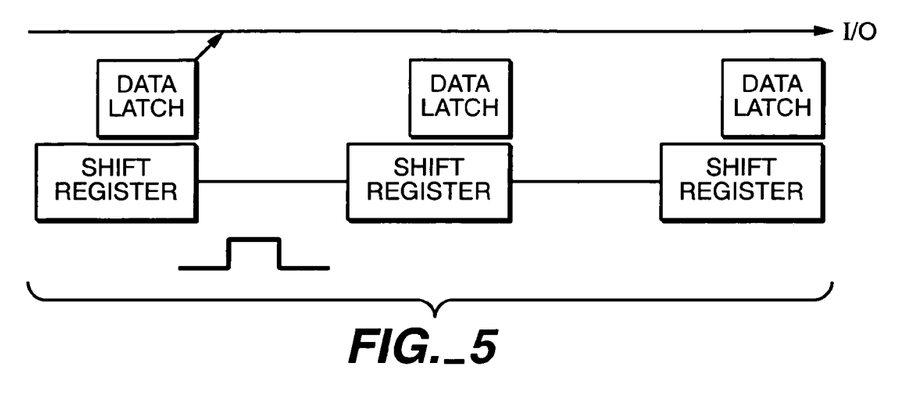
FIG. 5 shows connecting a first data latch to an I/O line by placing a 1 in a first stage of a shift register.
Figure 6:
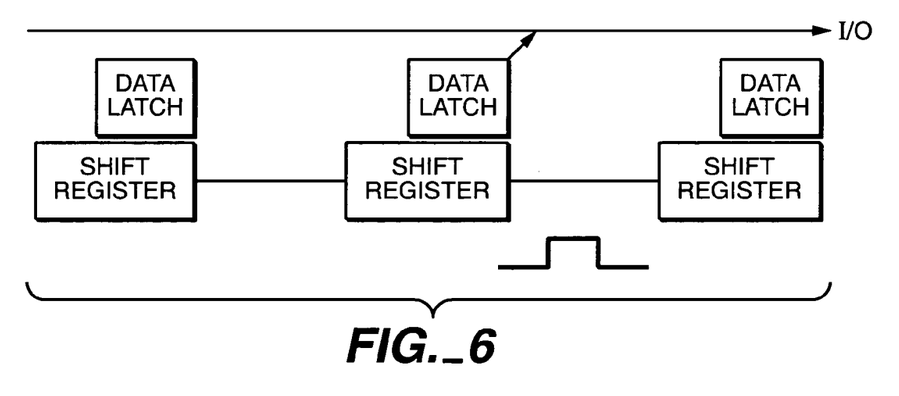
FIG. 6 shows connecting a second data latch to the I/O line by placing a 1 in a second stage of a shift register.

FIGS. 5 and 6 show more clearly the operation of latches and shift register. In FIG. 5, the first shift register has a 1; the data latch associated with that shift register and column is connected to the I/O line. In FIG. 6, the shift register has been clocked, and the next shift register has the 1; the data latch associated with that shift register and column is connected to the I/O line.

The circuitry may also be designed for an active low LOAD signal. Then, the shift register will contain all 1s and a 0 for the particular latches to be enabled (e.g., 1110111111).

For multistate (or multibit) memory cells that hold more than two bits per cell, there would be an additional latch for each additional bit. For example, for three bits per cell, there would be an additional two latches. Three latches for outputting data, and three latches for preparing data, or three to write, three to input new data for the next cycle. Only one shift register is required to provide an enable signal.

The embodiment of FIG. 3 shows a separate set of latches for shifting in or out (loading/unloading) data and the actual operation. In other embodiments, one set of latches may be shared to handle serially the shifting and this will save integrated circuit area. However, by having individual sets of registers for read and write, this improves performance because both types of data may be input and output at the same time.

Compared to FIG. 1, the circuitry in FIG. 3 requires less integrated circuit area to obtain the same functionality. And, the integrated circuit area savings increases as the number of bits stored per memory cell increases. This is because a latch takes up about half the area as a master-slave register. For FIG. 1, the number of latches used per column is given by A=d*4 per column, where d is the number of bits stored in a single memory cell. For FIG. 3, the number of latches used per column is given by B=d*2+2. The table below summarizes the integrated circuit area savings by number of latches. As can be seen, as d increases, the integrated circuit area savings of approach B over approach A increases. And, there may be further integrated circuit area savings depending on the number of columns.

TABLE

| d<br>Number of Bits per Cell | A<br>Number of Latches Using Shift Registers | B<br>Number of Latches Using Dynamic Column Block Selection |
|---|---|---|
| 2 | 8 | 6 |
| 3 | 12 | 8 |
| 4 | 16 | 10 |
| 5 | 20 | 12 |
| 6 | 24 | 14 |
| 7 | 28 | 16 |
| 8 | 32 | 18 |

Another advantage of the FIG. 3 approach over that in FIG. 1 is a reduction in the amount of noise generated. When propagating a 1 (or 0 for active low) through the shift register to enable one set of latches, only one bit is being switched for each clock. Furthermore, only one set of latches is being connected to the I/O lines at a time. Both these contribute to reduce the amount of noise when inputting and output data from the memory cells. By reducing the amount of noise, this improves the reliability of the integrated circuit since it will be less like that data will be corrupted by noise.

In summary for the approach in FIG. 3, data are stored in latches instead of shift registers. In addition to the data latches, there is one chain of master-slave shift registers. A strobe pulse is shifted through these registers and points, with each clock, at a different latch, in sequence. That particular latch will be then connected to an input or an output line. So, in read, the selected latch will send the stored information to the output buffer, and while in programming, the selected latch will receive data from an input buffer.

Starting with two bits per cell, area can be saved with the approach of FIG. 3. In the approach of FIG. 1, a set of four master-slave shift registers, or eight latches, is used. Two set/reset registers (four latches) are used to store read or programming data, and two set/reset registers (another four latches) are used to shift in data during stream write, which provides for increased performance.

With the approach of FIG. 3, only six latches are necessary: Two latches (shift register) are for the shifting the strobe. Two latches are for storing old data, and two latches are for loading new data.

Furthermore, the circuitry of FIG. 3 is comparatively very quiet: one clock signal and one latch output switching (for the strobe) plus two I/Os to be driven, compared to six clocks and thousands of latches switching at a time.

There are many possible embodiments of the present invention. One embodiment may use a combined input/output (I/O) line to input and output data to the latches. There may be one I/O line for each latch or there may be one I/O line for two or more latches. For example, there may be one I/O line that is shared by four latches. Or there may be four I/O lines and four latches.

Figure 7:
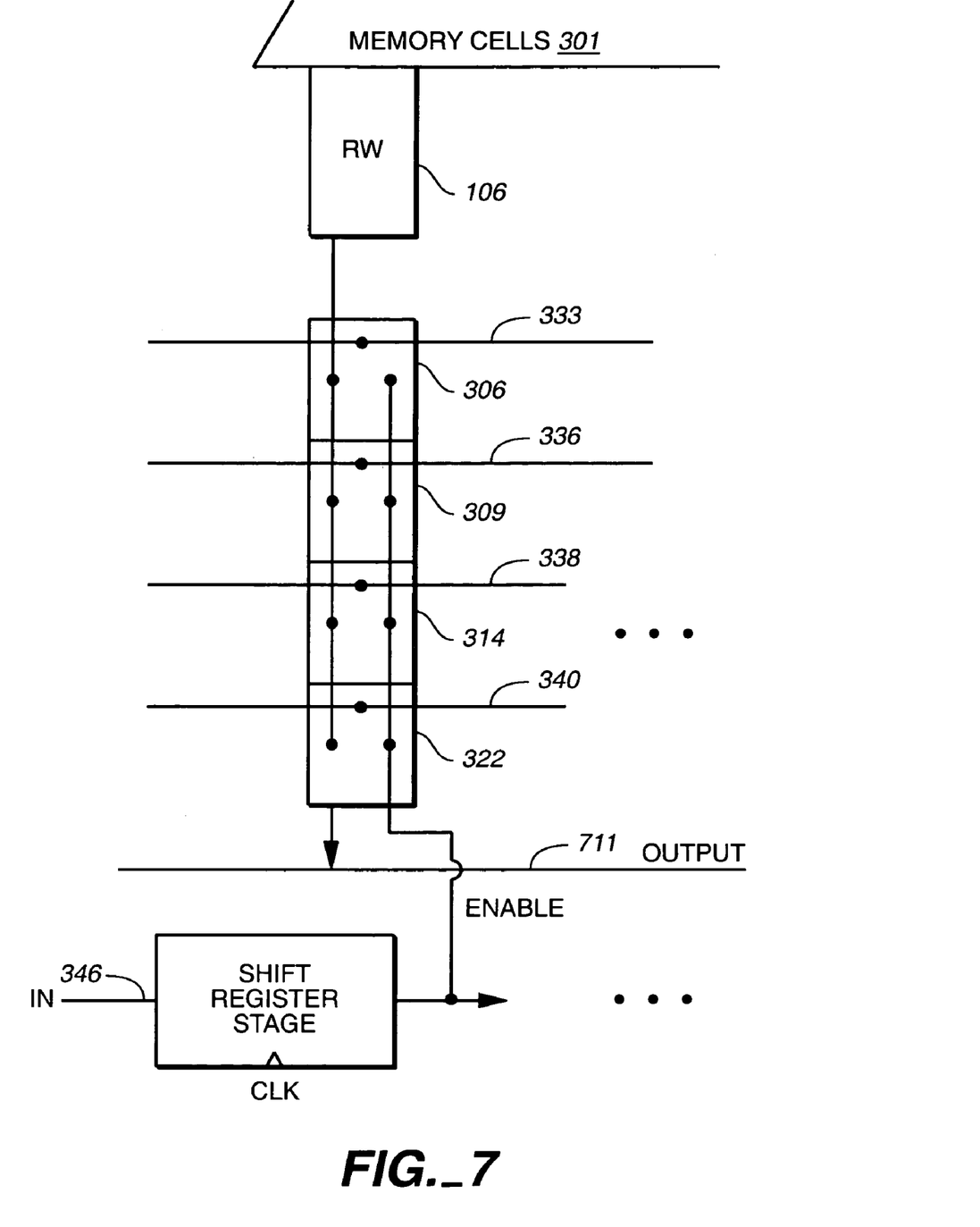
FIG. 7 shows an embodiment of the invention with multiple input lines and a single output line.

FIG. 7 shows the details of another embodiment of the invention. There are four input lines 333, 336, 338, and 340 for four latches 306, 309, 314, and 322, respectively. There is a single output line 711. When a particular column of latches is enabled using the ENABLE signal from the shift register, the data on an input line is connected to and stored in a respective latch. This data in the latches may be connected to the read-write circuit 106 for writing the data into the memory cells.

This implementation includes a single output line where data from the latches are output. Another embodiment may have four output lines, one for each of the latches. However, having more lines does impact die size, and having fewer lines produces a more compact layout.

Figure 8:
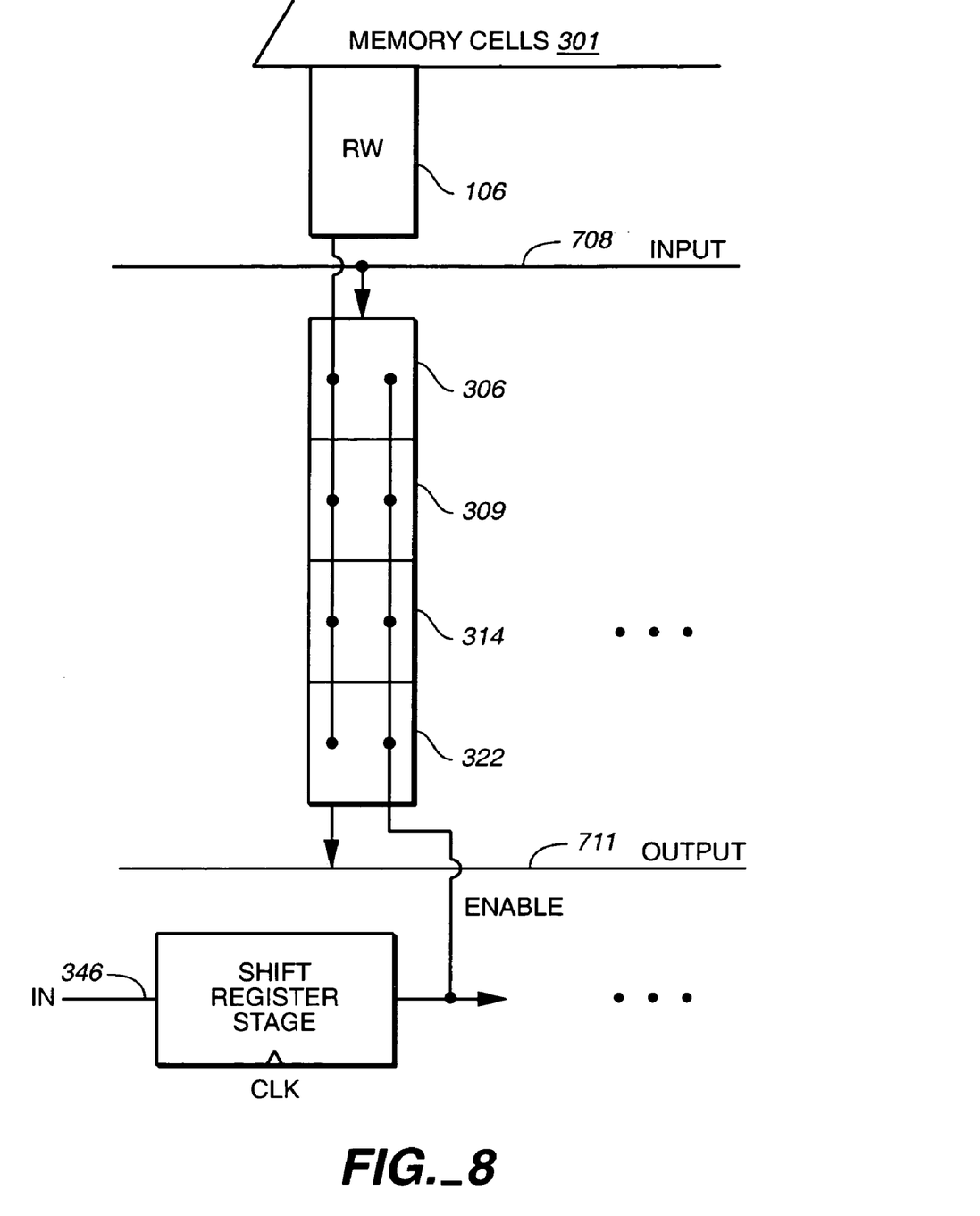
FIG. 8 shows an embodiment of the invention with a single input line and a single output line.

FIG. 8 shows another embodiment of the invention. There is a single input line 708 that is shared by the four latches 306, 309, 314, and 322. The data from the input line may be transferred to each latch. Compared to the FIG. 7 implementation, because there is a single input line in FIG. 8, this implementation provides for a more compact layout.

As illustrated by these specific embodiments, there is a multitude of permutations of the present invention. For example, there may be a single I/O line for two or more latches. There may be a single I/O line for each latch. There may be one input line for two or more latches. There may be a single input line for each latch. There may be one output line for two or more latches. There may be a single output line for each latch. And each of these embodiments may be combined with others. For example, there may be one output line and one input line. There may be one input line and four output lines.

FIGS. 9-12 show examples of a circuit architecture in which the present invention could be applied and are adapted from the foregoing discussion. FIGS. 9A-C show examples of a circuit for reading and writing data to memory cells 1301 of an integrated circuit. The integrated circuit may be a memory such as a Flash chip or may be an integrated circuit with an embedded memory portion, such as an ASIC or microprocessor with memory.

Figure 9A:
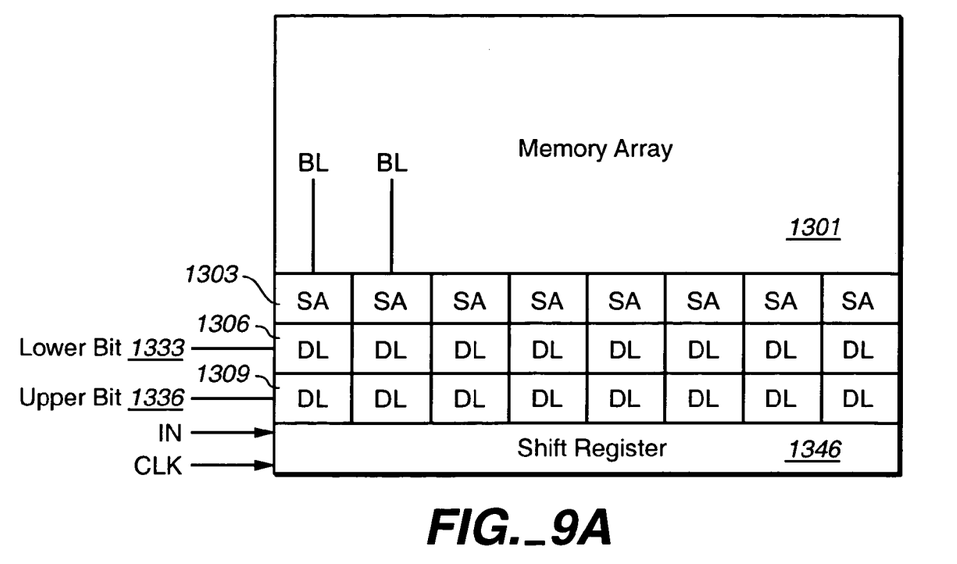
FIGS. 9A-C show integrated circuits with latches for holding data to be read and written into the memory.
Figure 9B:
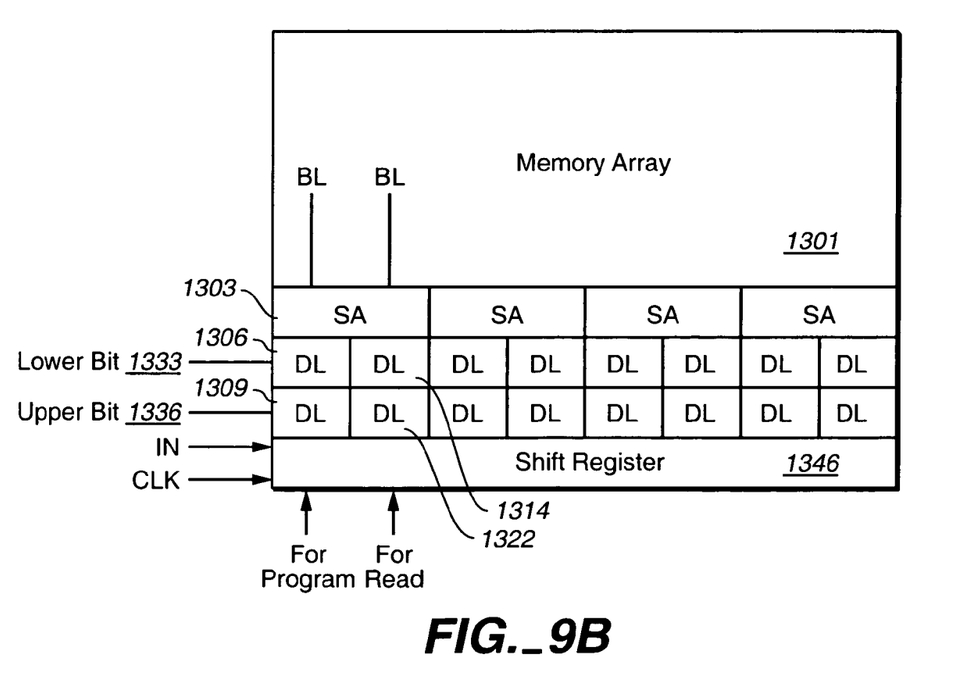
Figure 9C:
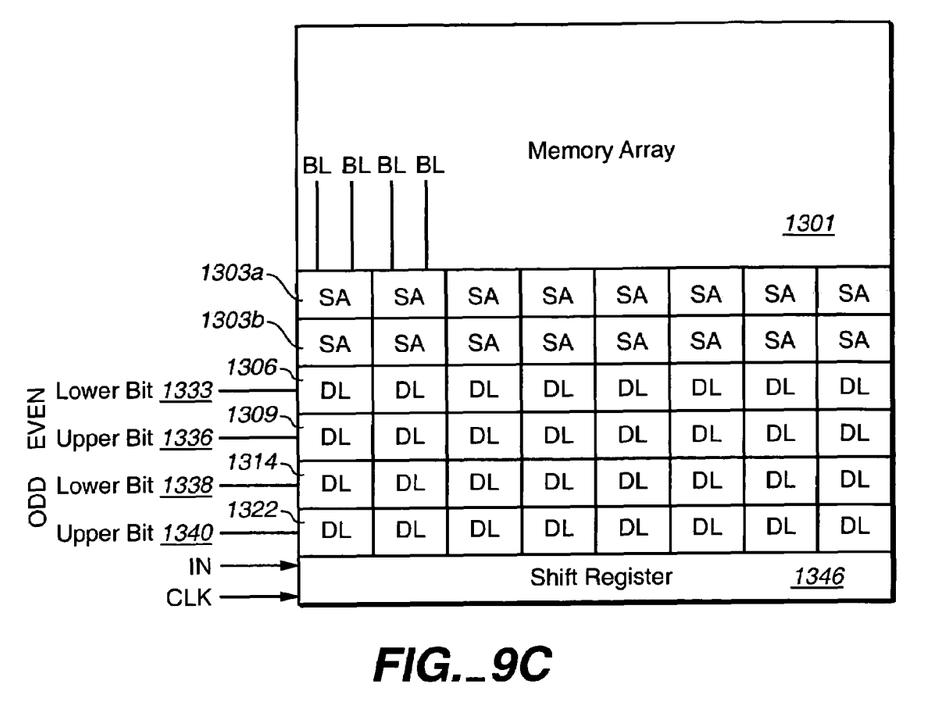

Read-write (SA) circuits 1303 are coupled to columns of one or more bit lines of memory cells. The read-write circuits are used to read the states of the memory cells. The read-write circuits may be also be used to write or store data into the memory cells. The read-write circuitry may include sense amplifier circuits.

A number of arrangements can be used for the latches and column select circuits. The embodiments of FIGS. 9A-C present different arrangements of the read-write circuit for the columns of memory cells. One arrangement is a "flat" structure, with each bit line having its own set of latches that can be directly accessed, either to load or output data, for transferring data to an input/output line in response to an enable signal from a column select circuit. In other embodiments, one read-write circuit may be shared among two or more columns of memory cells.

In the exemplary embodiments, the storage units are multistate, capable of storing multiple bits of data per cell. For the purpose of serving as an exemplary embodiment to illustrate the principles of the invention, memory cells 1301 of FIGS. 9A-C are dual-bit Flash EEPROM memory cells, so that the collection of memory cells selected by one word line can store either one page of user plus overhead data or two pages of such data, referred to as an upper and lower page. More generally, the concepts readily extend to either binary memory cells or multi-state memory cells that can store more than two bits of data. Similarly, the discussion extends to non-volatile memories with other forms of storage units as the principle aspects of the present invention relate to how the storage units are accessed and arranged, and are not particular to how the data is written to, stored on, or read from the storage units.

In the example of FIG. 9A, there are two temporary storage circuits or data latches DL 1306 and 1309, one for the "upper" bit and one for the "lower" bit associated with and connected to each read-write circuit SA 1303. The temporary storage circuits may be any circuitry used to hold data for the memory cells. In a specific implementation, the temporary storage circuits are latches; however, other types of logic may also be used. Each latch is connected to one of two input/output (I/O) lines, 1333 and 1336, used to input and output data into the latches. The details of the connection are not shown. In this simplified example, the latches and lines serve both the input and output function, although separate lines can also be used.

In the data input process, data is loaded bit-by-bit or more commonly byte-by-byte into the data latches. The Y-select circuits, such as 1346, are used to manage which byte is selected at a specific WE (write enable) clock. Data is loaded into a particular latch based on a WE signal input of each latch (not shown in FIG. 9). When the WE signal is asserted (active low or active high signal) for a particular latch, then that latch is loaded. For example, in FIG. 9C the Y-select circuit 1346 will select a particular data set on the I/O bus (lines 1333, 1336, 1338, 1340) that will then be connected to the selected data latches (1306, 1309, 1314 and 1322), which can be similar to those in FIG. 10.

In the data output processes, the data can be read out serially from a column of registers at a time. The Y-select will select a byte at a specific RE (Read Enable) clock. The data will transfer from the data latch to the I/O bus and from there the data will be transferred to the output buffer.

In FIG. 9B, each input/output circuit 1303 has four associated data latches, 1306, 1309, 1314, and 1322, with the first two respectively corresponding to the lower and upper bits for programming and the second two respectively corresponding to the lower and upper bits for reading.

In a folded structure, such as FIG. 9C, multiple input/output circuits such as 1303a and 1303b are stacked on top of each other. In this example, one of the input/output circuits belongs to an odd bit line and the other belonging to an even bit line. In a two bits per cell arrangement, there is a corresponding upper bit and lower bit data latch for each input/output circuit. As in FIG. 9A, the same latch is used for both the read and program data, although in a variation separate data latches for program and read can be used. Since this is a folded structure, the strobe pulse of the shift register will travel first in one direction, say from right to left, to access one of the bit lines, and when it meets the (counter defined) boundary, the strobe will turn around to go from left to right to access the other of the bit lines.

The I/O connections can have several options. In one case where the two bits stored in one physical cell belong logically to the same page and are written at the same time, it may be convenient to use two I/O lines, 1333 and 1336, to load the corresponding data latches 1306 and 1309 simultaneously (FIG. 9A). In the case of separate data latches for program and read as in FIG. 9B, the data latches 1306 and 1309 for program may be connected to DIN lines (Data In lines from input buffer), and the data latches 1314 and 1322 used for reading may be connected through I/O lines to output buffers.

In a another case often used in traditional NAND architectures, as described in U.S. patent application publication no. 2003/016182, which publication is incorporated herein by this reference, the lower bit data and upper bit data stored in each physical cell logically belong to different pages and are written and read at different times. Therefore, the lower bit data latch and the upper page data latch will be connected to same I/O line.

Figure 10:
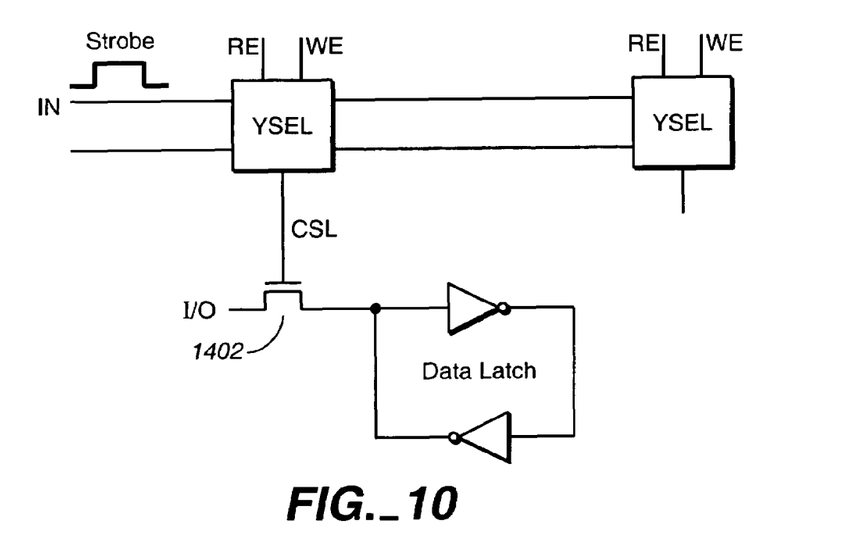
FIG. 10 shows an implementation of a latch.

An example of a specific circuit implementation of a latch is shown in FIG. 10. An input I/O is the data input to the latch, such as 1306, and will be connected to an input line, such as

1333. The column select signal CSL is connected to a pass transistor or pass gate 1402 that allows data to be connected to or disconnected from the input. The signal CSL is supplied from the Y or column select circuit YSEL that corresponds to one stage of the shift register 1346 of FIGS. 9A-C. This example of a latch circuit includes cross-coupled inverters to hold data and also connects to the read-write circuit so that data may be passed between the circuits. Other circuit implementations for a latch may also be used, such as NAND, NOR, XOR, AND, and OR gates, and combinations of these.

In this example, a read enable signal RE and write enable signal WE will be the clock to control the YSEL. A strobe will be propagate along the YSEL stages of the shift register. In the case of a folded structure, when the pulse reaches the last stage, it will propagate back in the other direction. When CSL is high, the data latch will be selected. The I/O line will then get the data from or put the data into the data latch. There are other possible implementations than a single input/output (I/O) line as described with respect to FIG. 9B.

The exemplary embodiment of FIG. 10 shows an NMOS or n-channel pass transistor. There are many ways to form a pass gate and any of these techniques may be used. For example, a CMOS pass gate, that includes NMOS and PMOS transistors connected in parallel, may be used. Also, a high voltage pass gate may be used. For example, a high-voltage NMOS pass gate is enabled or turned on (or placed in an on state) by placing a high voltage, above VCC, at its gate or control electrode. An NMOS pass gate is turned off or put in an off state by placing its control electrode at VSS or ground.

As described above, there are several arrangements for the relation of the data I/O lines and the data latches. If the data latch is "flat", as shown in FIGS. 9A and 9B, then the lines connected to 1306, 1309, 1314, 1322 belong to different I/O lines. In the FIG. 9A embodiment, each read-write circuit is connected to and has two latches associated with it that serve as both input and output latches. Alternately, as in FIG. 9B, two of these latches can be used to hold the data to be written into the memory cell, and two latches are used to hold the data read out of the memory cell.

The write data is input into the latches via the appropriate input lines and then written using the appropriate read-write circuit into the memory cells. Data from the memory cells is read out using the sense amplifier and stored into the latches. The read data is output from the latches using the appropriate output lines. The communication line between the latch and the read-write circuit is not shown.

Data is input from the latches one at a time using the input lines. This is done by using a column select signal (CSL), as described above, so that the latches associated with a read-write circuit or column in the array are connected to the input lines one at a time. The CSL signal for the latches comes from the shift registers. The shift registers are loaded with a pattern (for active high logic) which is all 0s, except for one 1 (e.g., 0001000000). This bit may be referred to as a strobe bit. For example, shift register associated with the first column has a 1, and the rest of the shift register bits contain 0. This 1 is connected to the ENABLE input of the latches for the first column, which connects one or more of these latches to the I/O lines 1333, 1336, 1338, and 1340. Data can be read or written to this column. The input to the shift register is connected to 0 and the shift register is clocked. The 1 propagates to the next shift register stage. This 1 is connected to the ENABLE input of the latches for the second column, which connects these latches to the I/O lines. This operation continues until the desired data is read or written from the latches.

Figure 11:
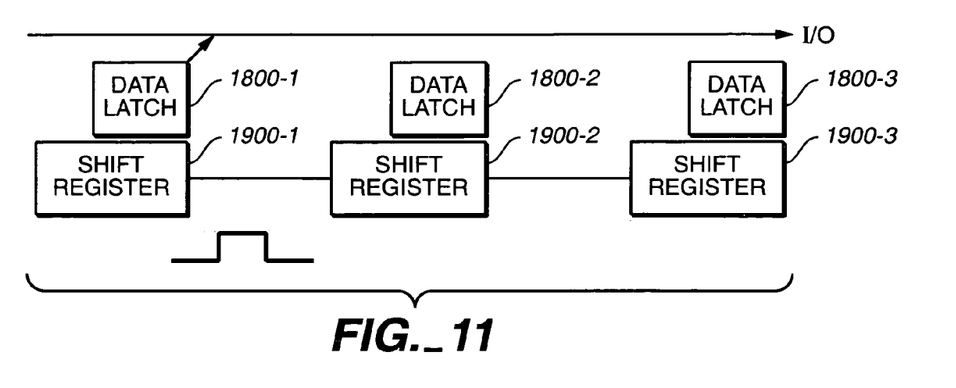
FIG. 11 shows connecting a first data latch to an I/O line by placing a 1 in a first stage of a shift register.
Figure 12:
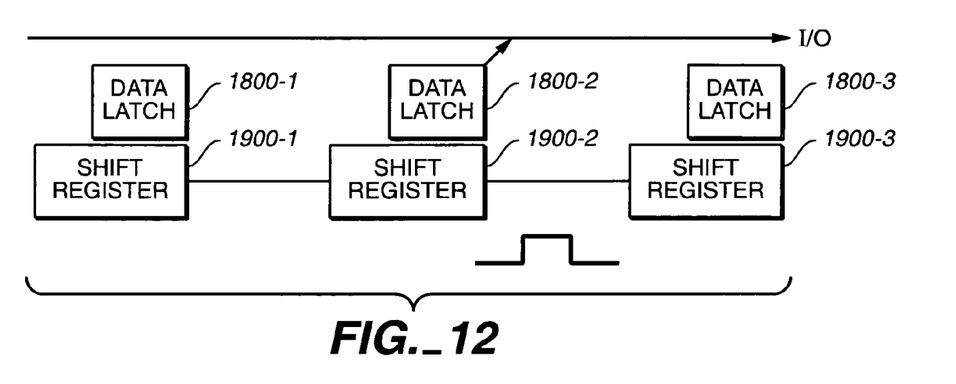
FIG. 12 shows connecting a second data latch to the I/O line by placing a 1 in a second stage of a shift register.

FIGS. 11 and 12 show more clearly the operation of latches and shift register. In FIG. 11, the first shift register has a 1; the data latch associated with that shift register and column is connected to the I/O line. In FIG. 12, the shift register has been clocked, and the next shift register bit has the 1; the data latch associated with that shift register and column is connected to the I/O line. The circuitry may also be designed for an active low LOAD signal. Then, the shift register will contain all 1s and a 0 for the particular latches to be enabled (e.g., 1110111111).

The preceding discussion illustrates the general principles involved and assumed that there is one (or two) bit lines per sense amp and one shift register stage per one or two sense amps. However, the concept can be usefully generalized such that there is one shift register stage per group of sense amps, the group of bit lines forming a column block. For example, there may be one or a few bytes of data associated with one column block, requiring, for example, 8 to 32 input lines in place of the one to four input lines shown in FIGS. 9A-C. In one specific example following the structure of FIG. 9A, each single BL line would consist of 8 bit lines, Sense Amp 1303 would read from and write to each of the 8 bit lines, each Data Latch 1306 and 1309 would hold 8 bits of data, and the upper bit and lower bit lines 1333 and 1336 would each be 8 bits wide. This allows a byte of data to be entered or read from each column block simultaneously.

In the case where one or more bit lines within a column block is bad, a method can be provided to skip over the bad column block. For example, in the scheme of FIGS. 9-12, if one column within the column block associated with shift register 1900-2 and data latch 1800-2 were bad, then the memory needs to skip the entire column block. According to one aspect of improvements further described in U.S. patent application Ser. No. 10/751,097, incorporated above by reference, the pulse of FIG. 11 passes through shift register 1900-2 without waiting for a second clock pulse and without selecting the latch 1800-2 to supply data to the I/O line. According to another aspect of those improvements, shift register 1900-2, data latch 1800-2, and the column block with which they are associated, in effect, become transparent as seen from the memory controller or the host.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

It is claimed:

1. A memory system, comprising:
an array of re-programmable non-volatile memory cells operated to store a given number of two or more bits of data per memory cell and connected with a plurality of bit lines,
a plurality of at least the given number of two or more temporary data storage latches connectable with individual ones of the plurality of bit lines for transferring data with addressed memory cells connected with the individual bit line,
at least one data input-output line,
a shift register including a plurality of series connected stages coupled with the temporary data storage latches in order to enable connection of different ones of the temporary data storage latches with the at least one input-output line in successive instances of time as a change of state is propagated from stage-to-stage therealong, and a clock source connected with the shift register to cause the change of state to be propagated along the stages thereof in sequence.

2. The memory of claim 1, wherein the at least one data input-output line comprises a plurality of data input-output lines.

3. The memory of claim 2, wherein the temporary data storage latches are connectable in parallel with the plurality of data input-output lines.

4. The memory of claim 3, wherein the temporary data storage latches are also connectable with different ones of the bit lines.

5. The memory of claim 1, wherein the temporary data storage latches individually store one bit of data.

6. The memory of claim 1, wherein data are not serially passed between the data latches.

7. The memory of claim 1, wherein the array of memory cells includes a NAND array of flash memory cells.

8. The memory of claim 1, wherein the memory cells include floating gates.

9. A memory system, comprising:

an array of re-programmable non-volatile memory cells operated to store a given number of bits of data per memory cell equal to two or more, the array of memory cells including a plurality of bit lines and a plurality of word lines operably connected with the memory cells to address a plurality of memory cells at a time along an individual word line for transferring data to and from the addressed memory cells through bit lines thereby connected therewith, a plurality of data input-output lines equal to at least the given number, a data circuit connected with each of the plurality of bit lines, comprising:

a read-write circuit including a sense amplifier that outputs the given number of bits read from the addressed memory cell of the individual bit line, and a plurality of data latches equal to at least the given number, thereby to temporarily store at least the given number of bits outputted by the sense amplifier of the reading circuit when the array is being read and store the given number of bits of data when the array is being programmed, a shift register including a plurality of series connected stages through which a change of state may be propagated from stage-to-stage therealong, outputs of the individual shift register stages being coupled with the pluralities of data storage latches of the data circuits connected to the individual bit lines in order enable connection of the plurality of data storage latches of one of the bit lines in parallel with different ones of the plurality of data input-output lines when the state of the shift register stage connected with the plurality of data storage latches for the one bit line is changed, and a clock source connected with the shift register to cause the change of state to be propagated along the stages thereof in sequence.

10. The memory system of claim 9, wherein the plurality of data latches of the data circuit connected with each of the plurality of bit lines includes a given number of data latches for storing data being programmed through the bit line and another given number of data latches for storing the output of the sense amplifier.

11. A memory system, comprising:

an array of re-programmable non-volatile memory cells operated to store a given number of bits of data per memory cell equal to two or more, the array of memory cells including a plurality of bit lines and a plurality of word lines operably connected with the memory cells to address a plurality of memory cells at a time along an individual word line for transferring data to and from the addressed memory cells through bit lines thereby connected therewith, a single data input line and a single data output line, a data circuit connected with each of the plurality of bit lines, comprising:

a read-write circuit including a sense amplifier that outputs the given number of bits read from the addressed memory cell of the individual bit line, and a plurality of data latches equal to at least the given number, thereby to temporarily store at least the given number of bits outputted by the sense amplifier of the reading circuit when the array is being read and store the given number of bits of data when the array is being programmed, a shift register including a plurality of series connected stages through which a change of state may be propagated from stage-to-stage therealong, outputs of the individual shift register stages being coupled with the pluralities of data storage latches of the data circuits connected with individual bit lines in order enable connection of the plurality of data storage latches of one of the bit line data circuits with one of the data input line or data output line when the state of the shift register stage connected with the plurality of data storage latches for the one bit line is changed, and a clock source connected with the shift register to cause the change of state to be propagated along the stages thereof in sequence.

12. The memory system of claim 11, wherein the plurality of data latches of the data circuit connected with each of the plurality of bit lines includes a given number of data latches for storing data being programmed through the bit line and another given number of data latches for storing the output of the sense amplifier.

* * * * *